(12) United States Patent
Kuboshima et al.

(10) Patent No.: US 6,690,220 B2
(45) Date of Patent: Feb. 10, 2004

(54) RESET CIRCUIT OF SEMICONDUCTOR CIRCUIT

(75) Inventors: Masanobu Kuboshima, Ibaraki (JP); Keisuke Tanaka, Toyonaka (JP); Toshihiko Maruoka, Ikeda (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/894,840

(22) Filed: Jun. 29, 2001

(65) Prior Publication Data

US 2002/0003442 A1 Jan. 10, 2002

(30) Foreign Application Priority Data

Jun. 30, 2000 (JP) ........................................ 2000-198295

(51) Int. Cl.$^7$ ................................................ H03K 3/02
(52) U.S. Cl. ........................ 327/198; 327/142; 327/538
(58) Field of Search ................................ 327/141, 142, 327/143, 155, 161, 551, 558, 103, 100, 165, 166, 198, 538, 205; 323/901

(56) References Cited

U.S. PATENT DOCUMENTS

| | | | |
|---|---|---|---|
| 4,438,357 A | * 3/1984 | Wicnienski | 327/143 |
| 4,438,473 A | 3/1984 | Cawley et al. | 361/18 |
| 5,570,050 A | * 10/1996 | Conary | 327/143 |
| 6,118,709 A | * 9/2000 | Zink et al. | 365/191 |

* cited by examiner

*Primary Examiner*—Minh Nguyen
(74) *Attorney, Agent, or Firm*—Parkhurst & Wendel, L.L.P.

(57) ABSTRACT

A reset circuit of a semiconductor circuit for reliably resetting plural reset target circuits in the semiconductor circuit, even when a surge noise signal having a short pulse length or the like is input to the reset circuit, the reset circuit including a reset signal control circuit for controlling timing of deactivating a reset instruction signal for resetting plural reset target circuits in the semiconductor circuit. Respective reset target circuits are for outputting reset completion signals to the reset signal control circuit when the respective reset target circuits have been reset. The reset signal control circuit also is for deactivating the reset instruction signal when all of the reset completion signals have been activated.

12 Claims, 11 Drawing Sheets

RESET CIRCUIT OF SEMICONDUCTOR CIRCUIT

FIELD OF THE INVENTION

The present invention relates to a reset circuit for reliably resetting plural circuits to be reset, which are included in a semiconductor circuit.

BACKGROUND OF THE INVENTION

A structure of a prior art reset circuit for resetting a semiconductor circuit will be described with reference to FIG. 8. To simplify the description, assume here that the number of plural circuits to be reset, i.e., reset target circuits in the semiconductor circuit is three.

As shown in FIG. 8, the prior art reset circuit is constituted by a reset terminal 100, a filter circuit 110, and first to third reset target circuits 241 to 243. A reset terminal input reset signal S100 which is input to the reset terminal 100 is input to the first to third reset target circuits 241 to 243 via the filter circuit 110, respectively, and resets the respective reset target circuits 241 to 243.

The filter circuit 110 is constituted by a low-pass filter 111 for eliminating high frequency components of a signal, and a Schmitt amplifier 112 for shaping the waveform of the signal from which the high frequency components have been eliminated by the low-pass filter 111. The filter circuit 110 eliminates the high frequency components of the reset terminal input reset signal S100 which is input from the reset terminal 100 to shape the waveform, thereby preventing the reset operation from being erroneously activated by noises which are input to the reset terminal 100.

Wiring between the filter circuit 110 and the reset target circuits 241 to 243 is accompanied by parasitic impedances 131 to 133, respectively, which are generated according to resistance components or capacitance components depending on the wiring, and contribute to blunting of the waveform of a reset start signal S210 which is output from the filter circuit 110. When the wave form of the reset start signal S210 is blunted, not all of the reset target circuits 241 to 243 can be reset, and only part of the reset target circuits are reset, there is a case for example where the third reset target circuit 243 cannot be reset while the reset start signal S210 is rising as shown in FIG. 9.

Hereinafter, with reference to FIGS. 9(a)~9(f), descriptions will be given of the operation of the reset circuit in a case where the reset terminal input reset signal S100 having a short pulse length due to surge noises or the like is input to the reset terminal 100 of the semiconductor circuit, and part of the plural reset target circuits 241 to 243 in the semiconductor circuit is not reset. FIGS. 9(a)~9(f) are signal timing charts for explaining the operation of the prior art reset circuit.

In FIG. 9, the same reference numerals as those in FIG. 8 denotes the same signals.

Initially, at time t11, the reset terminal input reset signal S100 (FIG. 9(a)) rises. With its rising, at time t12, a low-pass filter output reset signal S111 (FIG. 9(b)) which has passed through the low-pass filter 111 becomes higher than an upper threshold Vshh constituting a hysteresis of the Schmitt amplifier 112, and the reset start signal S210 (FIG. 9(c)) turns into H level.

Then, at time t13, the reset terminal input reset signal S100 falls. With its falling, at time t14, the low-pass filter output reset signal S111 which has passed through the low-pass filter 111 becomes lower than the level of a lower threshold Vshl constituting the hysteresis of the Schmitt amplifier 112, and the reset start signal S210 turns into L level.

This reset start signal S210 is blunted in different manners which vary with the properties of the resistances and capacitances of the parasitic impedances 131 to 133 before the signal is input to the first to third reset target circuits 241 to 243, and it is input to the reset target circuits 241 to 243 for example with the signal waveforms of the reset signals S210a to S210c as shown in FIGS. 9. To be specific, in FIG. 8, with regard to the parasitic impedances 131 to 133, the longer the wring lengths from the filter circuit 110 to the reset target circuits are, the larger the resistances and the capacitances are, respectively, and thus the waveform of the input signal is more blunted. In FIG. 9, it is shown by the waveforms of the reset signals S210a to S210c that the parasitic impedance 131 is the lowest and the parasitic impedance 133 is the highest.

The reset signal S210a which has been input to the first reset target circuit 241 exceeds a threshold Vth for the reset operation at time t25, and then the first reset target circuit 241 performs the reset operation. Similarly, with regard to the second reset target circuit 242, the reset signal S210b exceeds the threshold Vth for the reset operation at time t26, and thus the reset operation is performed. However, with regard to the third reset target circuit 243, since the reset signal S210c does not exceed the threshold Vth for the reset operation by the time t14 when the reset start signal S210 falls, the reset operation of the third reset circuit 243 is not performed.

In order to prevent the plural reset target circuits 241 to 243 in the semiconductor circuit from being partially reset as described above, the passband of the low-pass filter 111 is set narrower when the high frequency components of the signal are eliminated in the low-pass filter 111, or the hysteresis (range from Vshh to Vshl) of the Schmitt amplifier 112 is set larger.

However, since the parasitic impedance is increased with the miniaturization of the semiconductor circuit or an increase in the circuit scale in recent years, when the low-pass filter 111 is designed correspondingly to the parasitic impedance, the chip size of the semiconductor circuit is increased. In addition, in recent years, the power voltage of the semiconductor circuit is decreased, whereby the power voltage is diversified. Thus, it is difficult to design the Schmitt amplifier 112 so as to have a larger hysteresis.

SUMMARY OF THE INVENTION

It is an object of the present invention to provide a reset circuit of a semiconductor circuit, which does not partially reset a semiconductor circuit having plural reset target circuits but can reliably reset the semiconductor circuit even when a surge noise having a shorter pulse length or the like is input to the reset terminal.

Other objects and advantages of the present invention will become apparent from the detailed description and specific embodiments described are provided only for illustration since various additions and modifications within the spirit and scope of the invention will be apparent to those of skill in the art from the detailed description.

According to a 1st aspect of the present invention, there is provided a reset circuit of a semiconductor circuit including a first plurality of all reset target circuits, each circuit for being reset by a reset instruction signal, and each circuit for outputting a respective reset completion signal when reset by the reset instruction signal, wherein at least one of the first plurality of reset target circuits comprises an N-bit counter; and a reset instruction signal control means for receiving a reset start signal, outputting the reset instruction signal in response to the reset start signal, and controlling a timing for deactivating the reset instruction signal, in accordance with the reset completion signals, wherein the first plurality of reset target circuits are for outputting respective reset completion signals when the respective reset target circuits are reset by the reset instruction signal, and the reset instruction signal control means is for deactivating the reset instruction signal when all of the reset completion signals from the first plurality of reset target circuits are activated.

According to a 2nd aspect of the present invention, there is provided a reset circuit of a semiconductor circuit including plural reset target circuits, the reset circuit including at least one reset target circuit for being reset by a reset instruction signal, and for outputting a respective first reset completion signal when reset by the reset instruction signal; a monitor circuit that is reset only by the reset instruction signal and for outputting a second reset completion signal; and a reset instruction signal control means for receiving a reset start signal, outputting the reset instruction signal in response to the reset start signal, and controlling a timing for deactivating the reset instruction signal, in accordance with the first reset completion signal from the at least one reset target circuit and the second reset completion signal from the monitor circuit, wherein the reset instruction signal control means further deactivates the reset instruction signal when all of the first and second reset completion signals are activated.

According to a 3rd aspect of the present invention, in the reset circuit includes a plurality of reset target circuits for being reset by a reset instruction signal, and part of said plurality of reset target circuits for outputting first reset completion signals when reset by the reset instruction signal, said part of said plurality of reset target circuits comprises at least one reset target circuit, wherein at least one of said plurality of reset target circuits comprises an N-bit counter; and a monitor circuit for being reset only by the reset instruction signal and for outputting a second reset completion signal, and a reset instruction signal control means for deactivating the reset instruction signal when said second reset completion signal and said respective first reset completion signals, which are output from said part of said quantity of reset target circuits, are activated. According to a 4th aspect of the present invention, there is provided a reset circuit of a semiconductor circuit including plural reset target circuits, including at least one reset target circuit for being reset by a reset instruction signal; a monitor circuit for being reset only by the reset instruction signal and for outputting a reset completion signal; a reset instruction signal control means for receiving a reset start signal, outputting the reset instruction signal in response to the reset start signal, and controlling a timing for deactivating the reset instruction signal, in accordance with the reset completion signal; and delay means respectively arranged between each of said at least one reset target circuit and said monitor circuit, and said reset instruction signal control means, for delaying, respectively, the reset instruction signal directed to said at least one reset target circuit and said monitor circuit, wherein the monitor circuit is for receiving the reset instruction signal which has a longest delayed time generated by the delay means, and outputting the reset completion signal when the monitor circuit is reset by the reset instruction signal, and the reset instruction signal control means is for deactivating the reset instruction signal when the reset completion signal is activated.

According to a 5th aspect of the present invention, in the reset circuit of the semiconductor circuit of any of the 1st, 2nd and 4th aspects, in a case where the reset instruction signal and all of the reset completion signals are simultaneously activated, the reset instruction signal control means deactivates the reset instruction signal when the reset start signal is deactivated. Therefore, a reset circuit structure in which it is required to continuously reset the N reset target circuits while the reset instruction signal is being input can be realized.

According to a 6th aspect of the present invention, the reset circuit of the semiconductor circuit of any of the 1st, 2nd and 4th aspects comprises: a filter means for eliminating high frequency components of an input signal; and a Schmitt amplifier means for shaping a waveform of a signal which is output from the filter means, and in this reset circuit, an output of the Schmitt amplifier is used as the reset start signal. Therefore, noises or the like which are erroneously input to the reset circuit can be eliminated, to prevent the reset target circuits from being subjected to the reset operations by the noises or the like.

According to a 7th aspect of the present invention, the reset circuit of the semiconductor circuit includes a plurality of reset target circuits, each of the plurality of reset target circuits for being reset by a reset instruction signal, and part of said plurality of reset target circuits for outputting reset completion signals when reset by the reset instruction signal, said part of said plurality of reset target circuits comprises at least one reset target circuit, wherein at least one of said plurality of reset target circuits comprises an N-bit counter; and a reset instruction signal control means for receiving a reset start signal, outputting the reset instruction signal in response to the reset start signal, and controlling a timing for deactivating the reset instruction signal, in accordance with the reset completion signal, and the reset instruction signal control means for deactivating the reset instruction signal when the reset completion signals, which are output from said part of the plurality of reset target circuits, are activated.

DETAILED DESCRIPTION OF THE PREFERRED EMBODIMENTS

Embodiment 1

Hereinafter, the first embodiment of the present invention will be described.

In the first embodiment, plural reset target circuits which are to be reset in a semiconductor circuit each output a reset completion signal when the reset target circuits have been reset, and a reset instruction signal for resetting the respective reset target circuits is controlled not to be canceled until the reset completion signals from the respective reset target circuits are all output.

Figure 1:
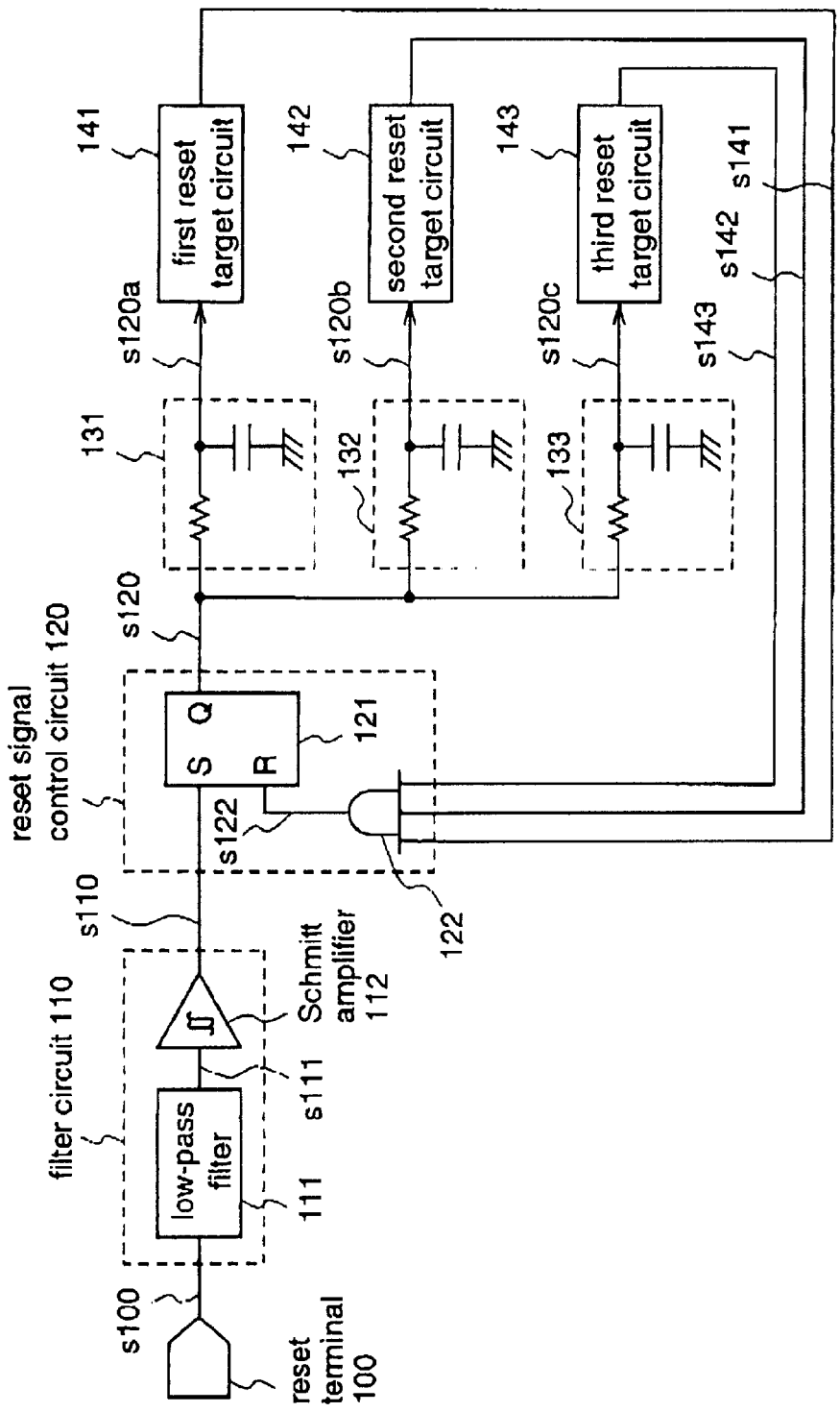
FIG. 1 is a diagram illustrating a structure of a reset circuit according to a first embodiment of the present invention.

Initially, with reference to FIG. 1, the structure of the reset circuit according to the first embodiment is described. FIG. 1 is a diagram illustrating the structure of the reset circuit of the first embodiment. Also in this first embodiment, to simplify the description, assume that the number of plural reset target circuits in the semiconductor circuit is three like in the prior art.

As shown in FIG. 1, the reset circuit of the first embodiment is constituted by a reset terminal 100, a filter circuit 110, a reset signal control circuit 120 and first to third reset target circuits 141 to 143, and the wiring between the reset signal control circuit 120 and the reset target circuits 141 to 143 is accompanied by parasitic impedances 131 to 133, respectively, which are generated according to the resistance components or capacitance components of the wiring.

Figure 3:
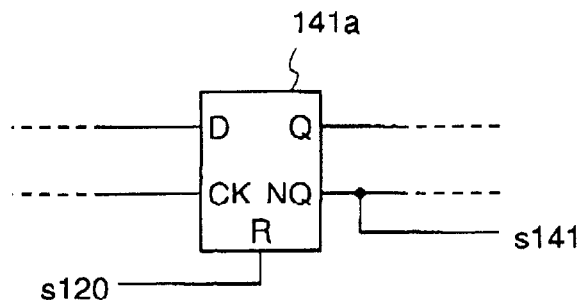
FIG. 3 is a block diagram illustrating a specific example of a reset target circuit of the reset circuit according to the first embodiment.
Figure 4:
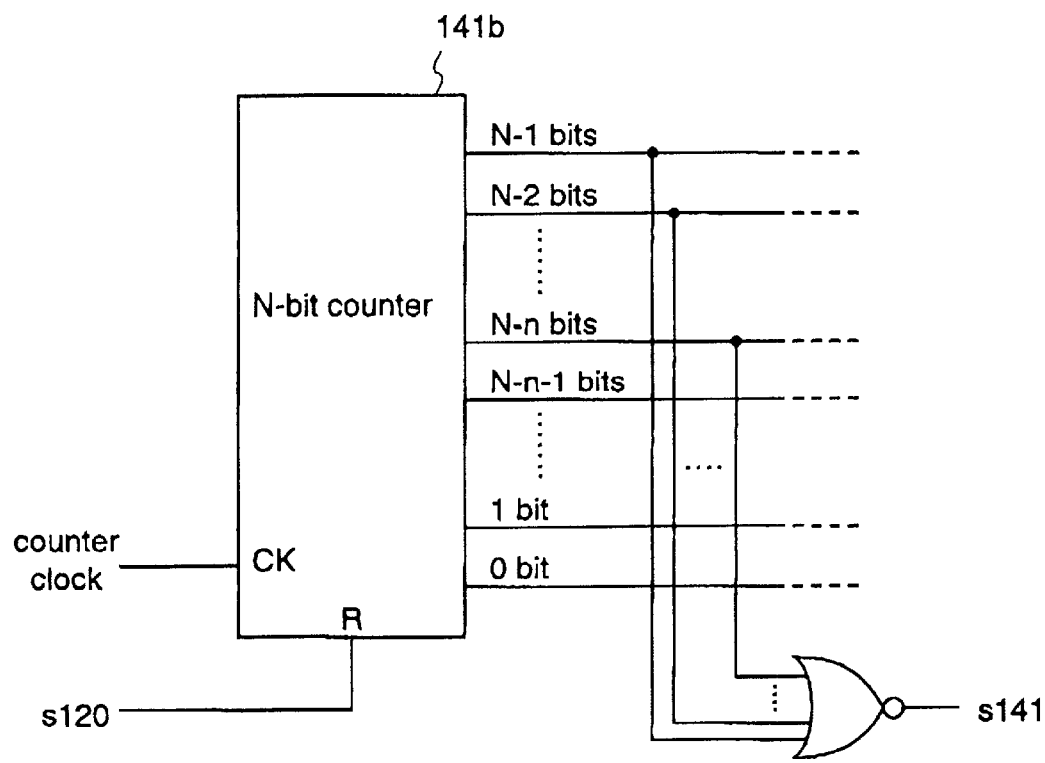
FIG. 4 is a block diagram illustrating a specific example of a reset target circuit of the reset circuit according to the first embodiment.

The first to third reset target circuits 141 to 143 of the first embodiment are constructed to output reset completion signals S141 to S143 when the reset target circuits have been reset, respectively. Here, specific examples of the reset target circuits are described with reference to FIGS. 3 and 4. FIGS. 3 and 4 are block diagrams illustrating the specific examples of the reset circuit according to the first embodiment. Here, assume that the reset target circuit shown in FIGS. 3 or 4 is the first reset target circuit.

It is conceivable that the first reset target circuit 141 is for example a reset attached delayed flipflop circuit 141a as shown in FIG. 3. To be more specific, in the reset attached delayed flipflop circuit 141a, with utilizing that an initial value of the NQ output turns into H level after the reset attached delayed flipflop circuit 141a was reset, when the NQ output of the delayed flipflop circuit 141a changes from L level to H level, it is judged that the reset attached delayed flipflop circuit 141a as a reset target circuit has been reset, and then the NQ output is output to the reset signal control circuit 120 as the reset completion signal S141.

As another example, it is conceivable that the first reset target circuit 141 is an N-bit counter as shown in FIG. 4. To be more specific, in the N-bit counter 141b, with utilizing that N-1-bit to 0-bit outputs are all at L level after the N-bit counter 141b has been reset, when outputs of upper n bits of the N-bit counter 141b are all at L level, it is judged that the N-bit counter 141b as a reset target circuit has been reset, and all of the outputs of the upper n bits of the N-bit counter are decoded to be output to the reset signal control circuit 120 as the reset completion signal S141.

The reset signal control circuit 120 comprises a reset signal retain means 121 and an AND gate 122, wherein the reset signal control circuit 120 constitutes the reset instruction signal control means. The reset signal retain means 121 is constituted for example by a reset attached flipflop circuit, and outputs the reset instruction signal S120 from when a reset start signal S110 which is output from the filter circuit 110 is input until a reset cancel signal S122 which is output from the AND gate 122 is input. The AND gate 122 obtains an AND logic of the reset completion signals S141 to S143 which are input from the first to third reset target circuits 141 to 143, and outputs the result of the AND logic as the reset cancel signal S122. Since other construction is identical to that of the prior art, the same reference numbers as those in the prior art denote the same elements.

Figure 2:
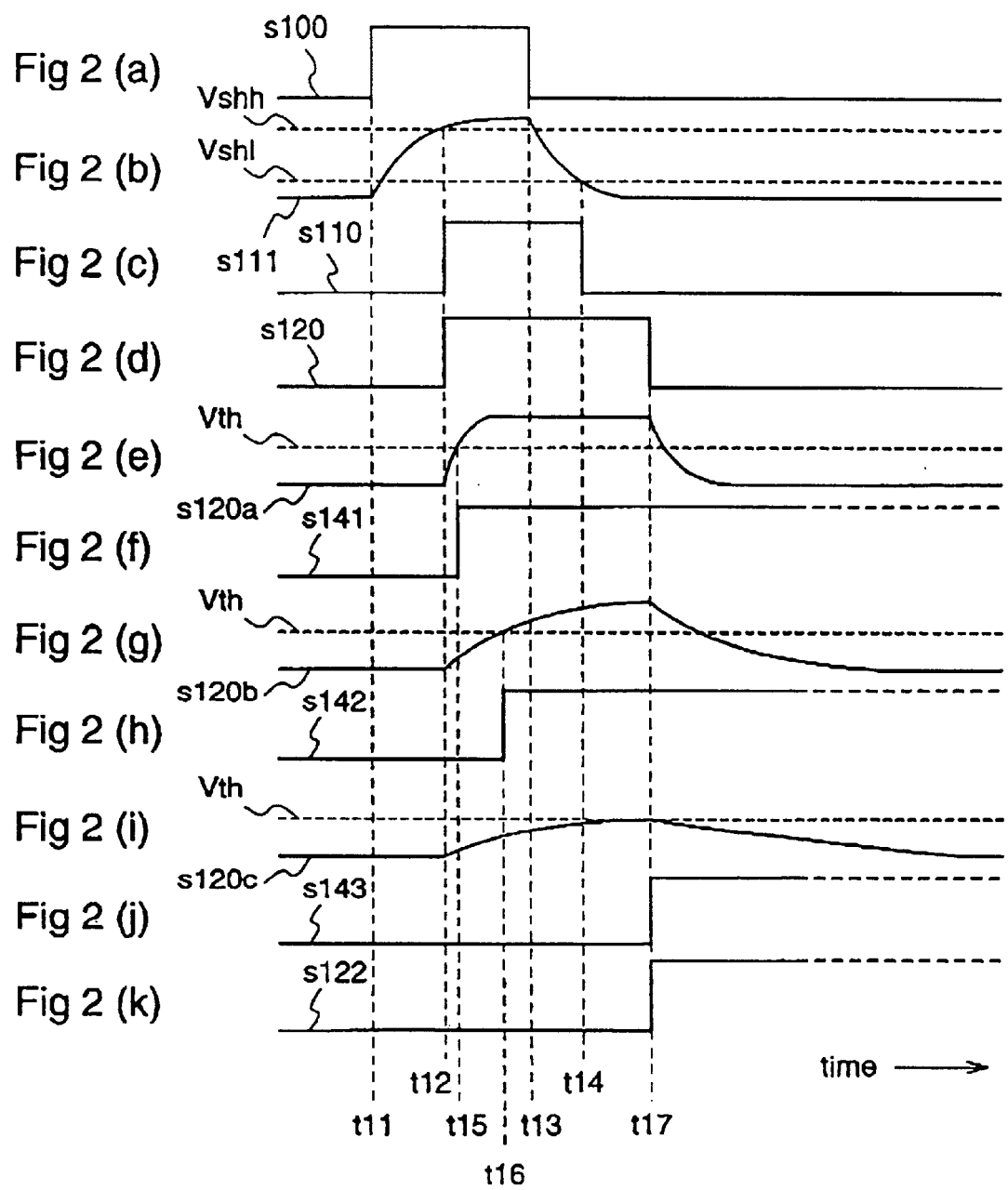
FIGS. 2(a)~2(k) are signal timing charts in a case where a surge noise or the like is input to the reset circuit of the first embodiment.

Hereinafter, the operation of the so-constructed reset circuit of the first embodiment is described with reference to FIG. 2. FIG. 2 is a signal timing chart for explaining the operation of the reset circuit of the first embodiment. In this first embodiment, like in the first embodiment, assume that a reset terminal input reset signal S100 (FIG. 2(a)) having a shorter pulse length due to a surge noise or the like is input to the reset terminal 100.

Initially, at time till, the reset terminal input reset signal S100 which has been input to the reset terminal 100 rises. With its rising, at time t12, a low-pass filter output signal Sill (FIG. 2(b)) which has passed through the low-pass filter 111 becomes higher than an upper threshold Vshh constituting a hysteresis of the Schmitt amplifier 112, and the reset start signal S110 (FIG. 2(c)) which is output from the filter circuit 110 turns into H level. Then, at time t13, the reset terminal input reset signal S100 falls. With its falling, at time t14, the low-pass filter output reset signal S111 which has passed through the low-pass filter 111 becomes lower than the level of a lower threshold Vshl constituting the hysteresis of the Schmitt amplifier 112, and the reset start signal S110 turns into L level.

The reset signal retain means 121 starts retaining the reset instruction signal S120 (FIG. 2(d)) at H level from the time t12 when the reset start signal S110 rose, and then the reset instruction signal S120 is changed into reset signals S120a to S120c as shown in FIGS. 2(e), 2(g) and 2(i) due to the parasitic impedances 131 to 133 like in the prior art, to be input to the first to third reset target circuits 141 to 143, respectively. The reset signals S120a to S120c reset the internal operations of the reset target circuits 141 to 143, respectively.

When it is detected in the respective reset target circuits 141 to 143 that the reset signals S120a to S120c have exceeded a threshold Vth for the reset operation and the reset target circuits 141 to 143 have been reset, the reset target circuits 141 to 143 output the reset completion signals S141 to S143 to the reset signal control circuit 120, respectively. To be more specific, the reset completion signal S141 (FIG. 2(f)) is output from the first reset target circuit 141 at time t15, and the reset completion signal S142 (FIG. 2(h)) is output from the second reset target circuit 142 at time t16.

Figure 9:
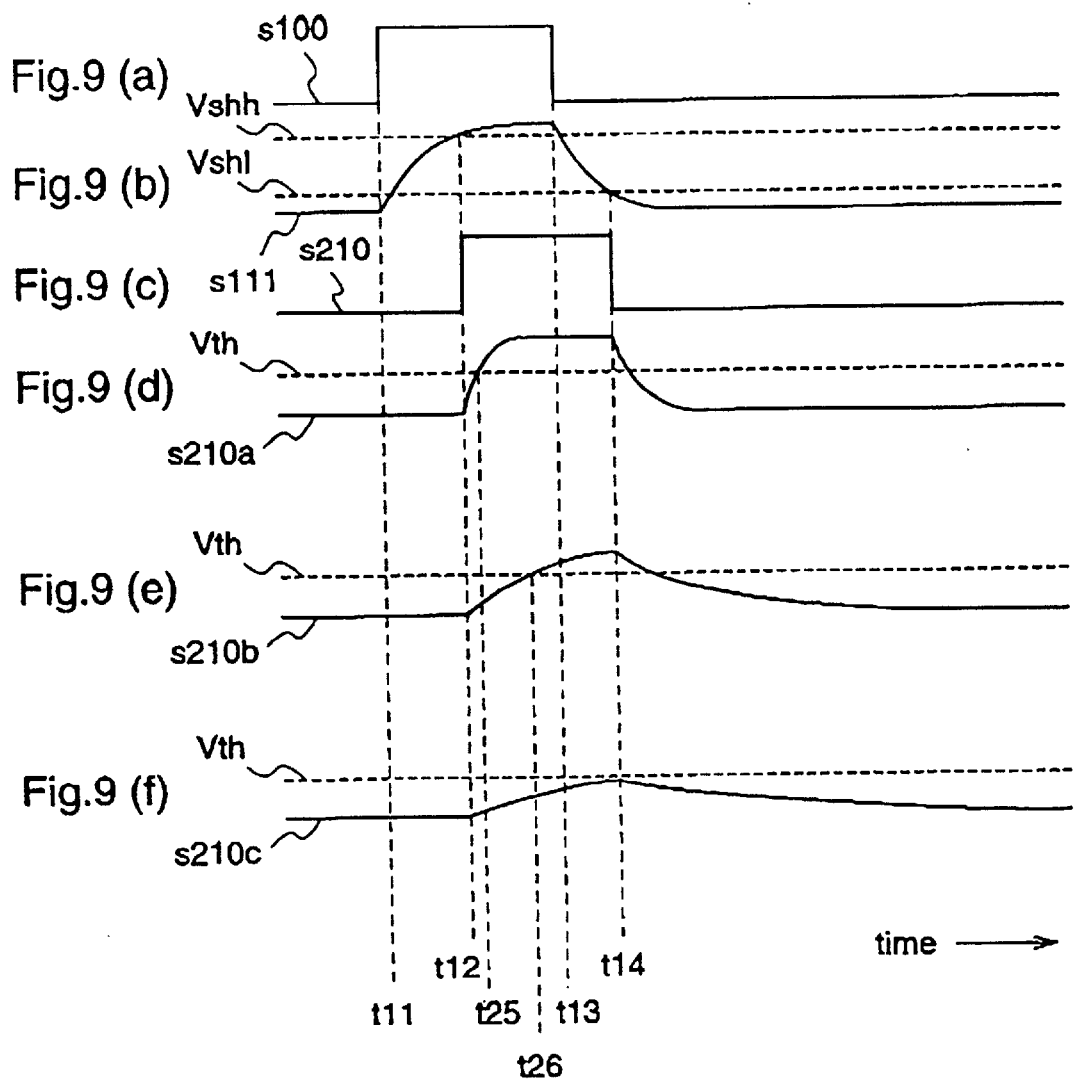
FIGS. 9(a)~9(f) are signal timing charts in a case where a surge noise or the like is input to the prior art reset circuit.

In the prior art, when the reset start signal S210 falls at time t14, the reset signals S210a to S210c which are input to the reset target circuits 241 to 243 fall at the same time (see FIG. 9). However, in this first embodiment, the reset instruction signal S120 is controlled by the reset signal control circuit 120, thereby preventing the reset signals S120a to S120c which are input to the respective reset target circuits 141 to 143 from falling even when the reset start signal S110 falls at time t14.

Therefore, the third reset target circuit 243 is not reset in the prior art while the reset of the third reset target circuit 143 is completed at time t17 in this first embodiment, and the reset completion signal S143 (FIG. 2(j)) is output from the third reset target circuit 143 to the reset signal control circuit 120.

When all of the reset completion signals S141 to S143 turn into H level at time t17, the AND gate 122 makes the reset cancel signal S122 (FIG. 2(k)) rise. The reset signal retain means 121 makes the reset instruction signal S120 fall at the same time as the rising of the reset cancel signal S122, thereby reliably resetting the plural reset target circuits 141 to 143 in the semiconductor circuit.

Figure 5:
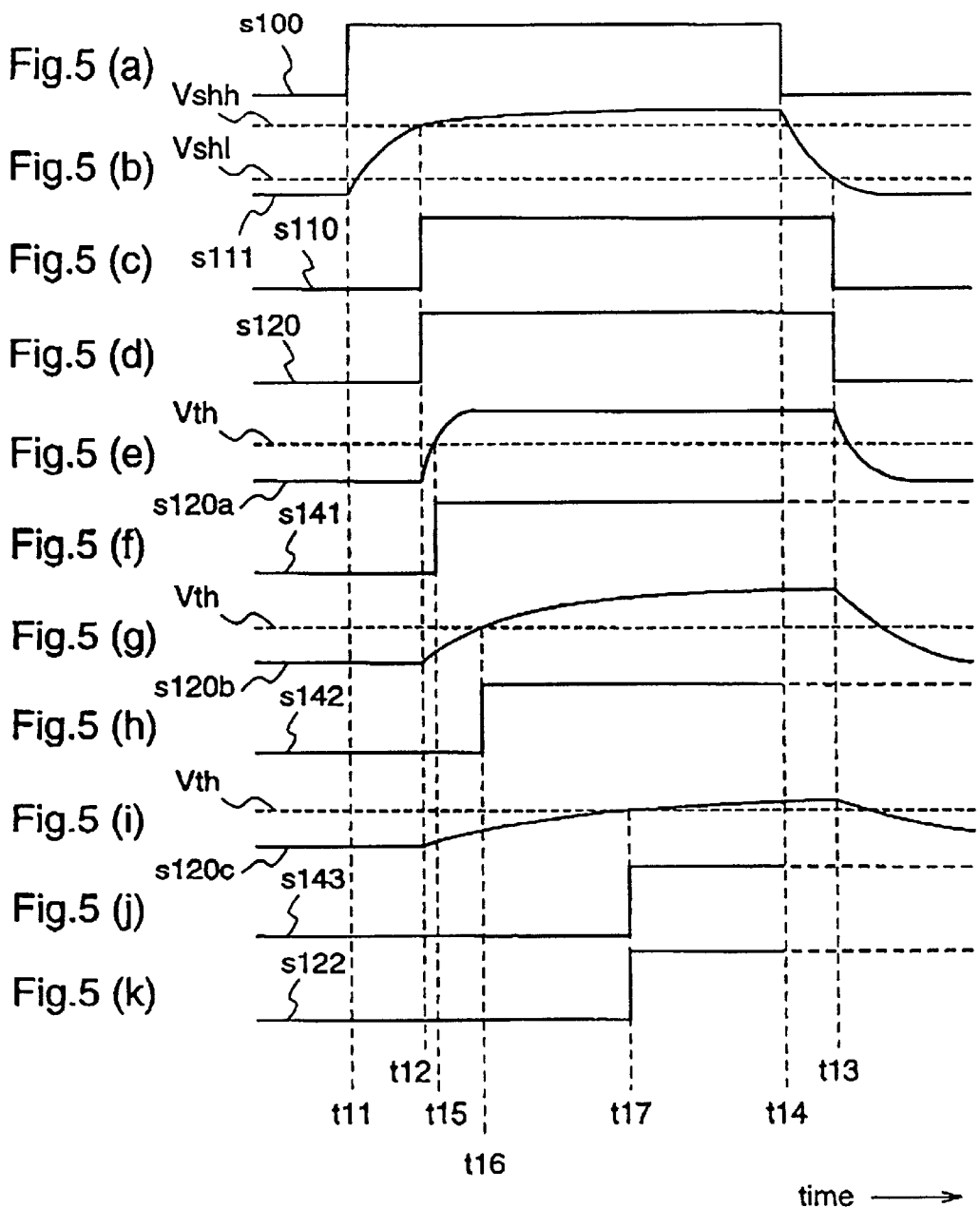
FIGS. 5(a)~5(k) are signal timing charts in a case where a reset signal having a longer pulse length is input to the reset circuit of the first embodiment.

Further, in the description of the operation of the reset circuit, since the reset terminal input reset signal S100 is a surge noise or the like and the pulse length of the input signal is short, the reset start signal S110 falls before the reset cancel signal S122 rises. Here, a description will be given of the operation of the reset circuit, for example in a case as shown in FIGS. 5 where a reset terminal input reset signal S100 (FIG. 5(a)) is a reset signal having a longer pulse length, and the reset cancel signal S122 (FIG. 5(k)) rises before the reset start signal S110 (FIG. 5(c)) falls.

In this case, the reset start signal S110 and the reset cancel signal S122 are simultaneously input to the reset signal retain means 121, and thus the reset signal retain means 121 should give priority to one of the signals. When it is required that the plural reset target circuits 141 to 143 should be continuously reset by the respective reset signals S120a to S120c (FIGS. 5(e), 5(g) and 5(i)) while the reset start signal S110 is being input to the reset circuit, the reset signal retain means 121 gives priority to the reset start signal S110 over the reset cancel signal S122, and controls the reset instruction signal S120 (FIG. 5(d)) not to fall until the reset start signal S110 falls at time t13, even when the reset cancel signal S122 (FIG. 5(k)) rises at time t17.

As described above, in the first embodiment, when a signal having a shorter pulse length such as a surge noise or the like is input to the reset terminal 100, and even when this signal cannot be eliminated by the filter circuit 110 and has passed through the filter circuit 110, the reset signal control circuit 120 controls the reset instruction signal S120 to be at H level correspondingly to the rising of the reset start signal S110, receives the reset completion signals S141 to S143 which are output from the first to third reset target circuits 141 to 143, and retains the reset instruction signal S120 at H level until it confirms that all of the reset target circuits have been reset and then the reset cancel signal S122 is risen. Therefore, partial resetting of the first to third reset target circuits 141 to 143 can be prevented, whereby the plural reset target circuits 141 to 143 in the semiconductor circuit can be reliably reset.

In this first embodiment, all of the reset target circuits 141 to 143 output the reset completion signals S141 to S143, respectively. However, when only at least one of the reset target circuits 141 to 143 whose reset operation is especially important outputs the reset completion signal, and the AND gate 122 obtains the AND logic to output the reset cancel signal S122, the structure in which not all of the reset target circuits in the semiconductor circuit output the reset completion signal enables to reliably reset the semiconductor circuit. Particularly, in a large-scale semiconductor circuit, the structure of the semiconductor circuit can be miniaturized with this construction.

Further, in a case where the reset completion signal is output from at least one of the plural reset target circuits as described above, assuming that the reset target circuit which outputs the reset completion signal is the one having the highest parasitic impedance among the plural reset target circuits and receiving the reset instruction signal S120 the latest, the reset instruction signal S120 does not fall until this reset target circuit is reset by the reset signal whose waveform is blunted by the highest parasitic impedance and then the reset completion signal is output. Therefore, the plural reset target circuits in the semiconductor circuit can be reliably reset, whereby the same effects as those described above can be obtained.

In the first embodiment, the parasitic impedances 131 to 133 which accompany the wiring between the reset signal control circuit 120 and the reset target circuits 141 to 143 depend on the resistances, capacitances or the like of the wiring, and constitute a delay means. However, when transistors of plural stages are used, the reset signals S120a to S120c which are input to the reset target circuits 141 to 143 are similarly delayed.

Embodiment 2

Hereinafter, the second embodiment of the present invention will be described.

In this second embodiment, in addition to the plural reset target circuits, a monitor circuit which is reset only by the reset signal and outputs the reset completion signal is included in the semiconductor circuit, and the reset instruction signals for resetting the respective reset target circuits are controlled not to be canceled until all of the reset completion signals from the reset target circuits and the reset completion signal from the monitor circuit are output.

Figure 6:
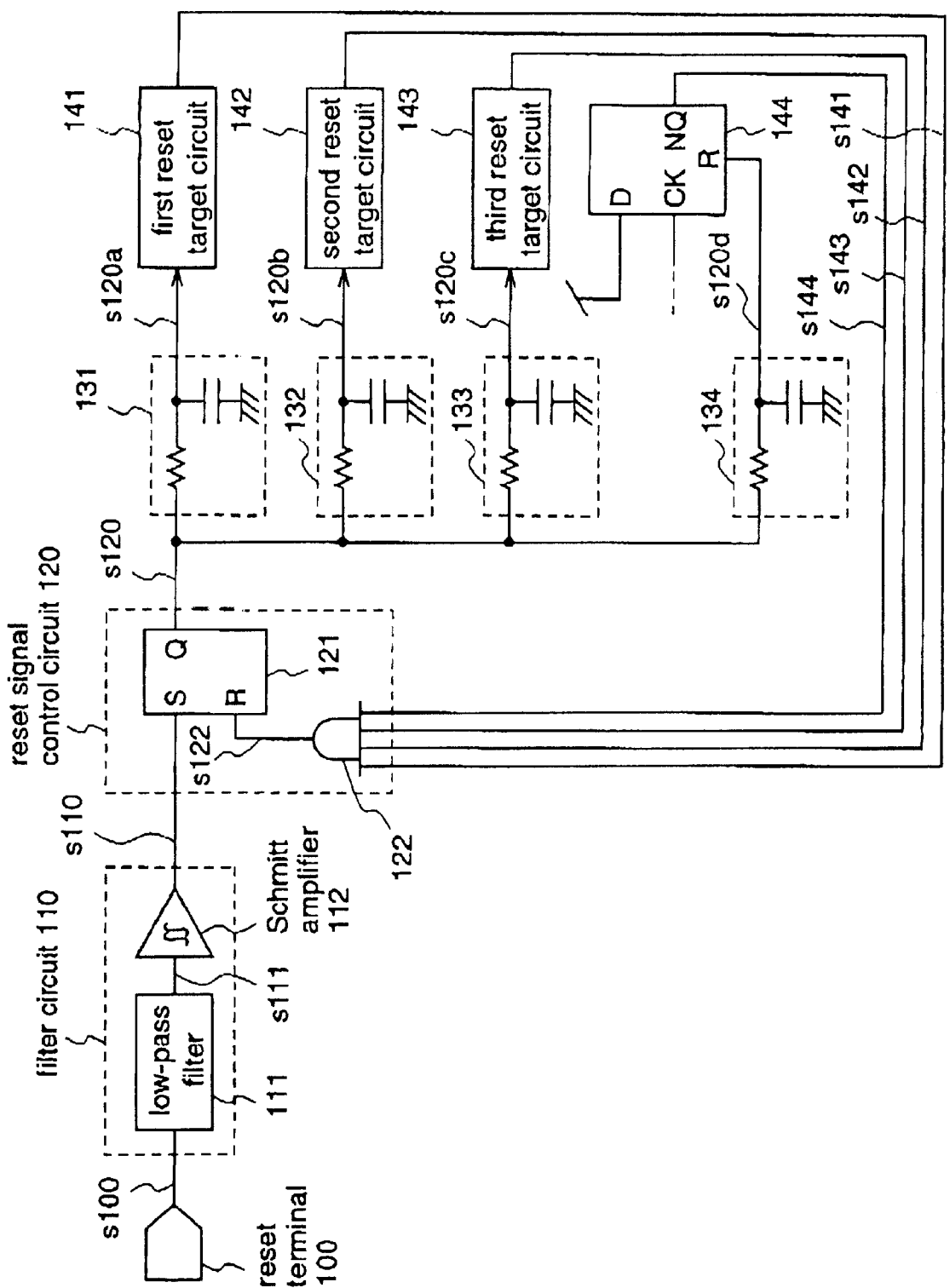
FIG. 6 is a diagram illustrating a structure of a reset circuit according to a second embodiment of the present invention.

Initially, a structure of the reset circuit according to the second embodiment is described with reference to FIG. 6. FIG. 6 is a diagram illustrating the structure of the reset circuit of the second embodiment. Also in the second embodiment, like in the prior art, in order to simplify the description, assume that the number of plural reset target circuits in the semiconductor circuit is three.

As shown in FIG. 6, the reset circuit of the second embodiment is constituted by a reset terminal 100, a filter circuit 110, a reset signal control circuit 120, first to third reset target circuits 141 to 143 and a monitor circuit 144, and the wiring between the reset signal control circuit 120 and the reset target circuits 141 to 143 and the monitor circuit 144 is accompanied by parasitic impedances 131 to 134, respectively, which are generated according to the resistance components or capacitance components of the wiring, as in the first embodiment, and constitute a delay means. In this FIG. 6, the same reference numerals as those in FIG. 1 denote the same elements.

The monitor circuit 144 is constituted for example by a delayed flipflop circuit to which no data are input, and the monitor circuit 144 is reset only by a reset signal S120d and outputs a reset completion signal S144 from its NQ output to the reset signal control circuit 120. To be more specific, in the reset target circuits 141 to 143, there are possibilities that the reset completion signals S141 to S143 may be output according to input data or counters even when the reset start signal S110 is not output. Thus, in the second embodiment, the monitor circuit 144 which outputs the reset completion signal S144 only when the reset signal S120d is input is included. Accordingly, even when all of the reset target circuits 141 to 143 output the reset completion signals S141 to S143 before the reset signals S120a to S120c are input, the respective reset target circuits are enabled to be reliably reset. The monitor circuit is not limited to the delayed flipflop circuit, and any circuit can be used as long as it has a structure for outputting the reset completion signal when the reset instruction signal is input to the circuit and stopping the output of the reset completion signal a predetermined time after the input of the reset instruction signal is stopped.

The parasitic impedance 134 of the monitor circuit 144 is set higher than the other parasitic impedances 131 to 133, and the reset signal S120d is blunted by the parasitic impedance 144 the most and transmitted the latest as compared with the other reset signals S120a to S120c. To be more specific, in FIG. 6, this can be realized for example by locating the monitor circuit 144 at a position having a longer wring length from the reset signal control circuit 120, as compared to the other reset target circuits 141 to 143.

Figure 7:
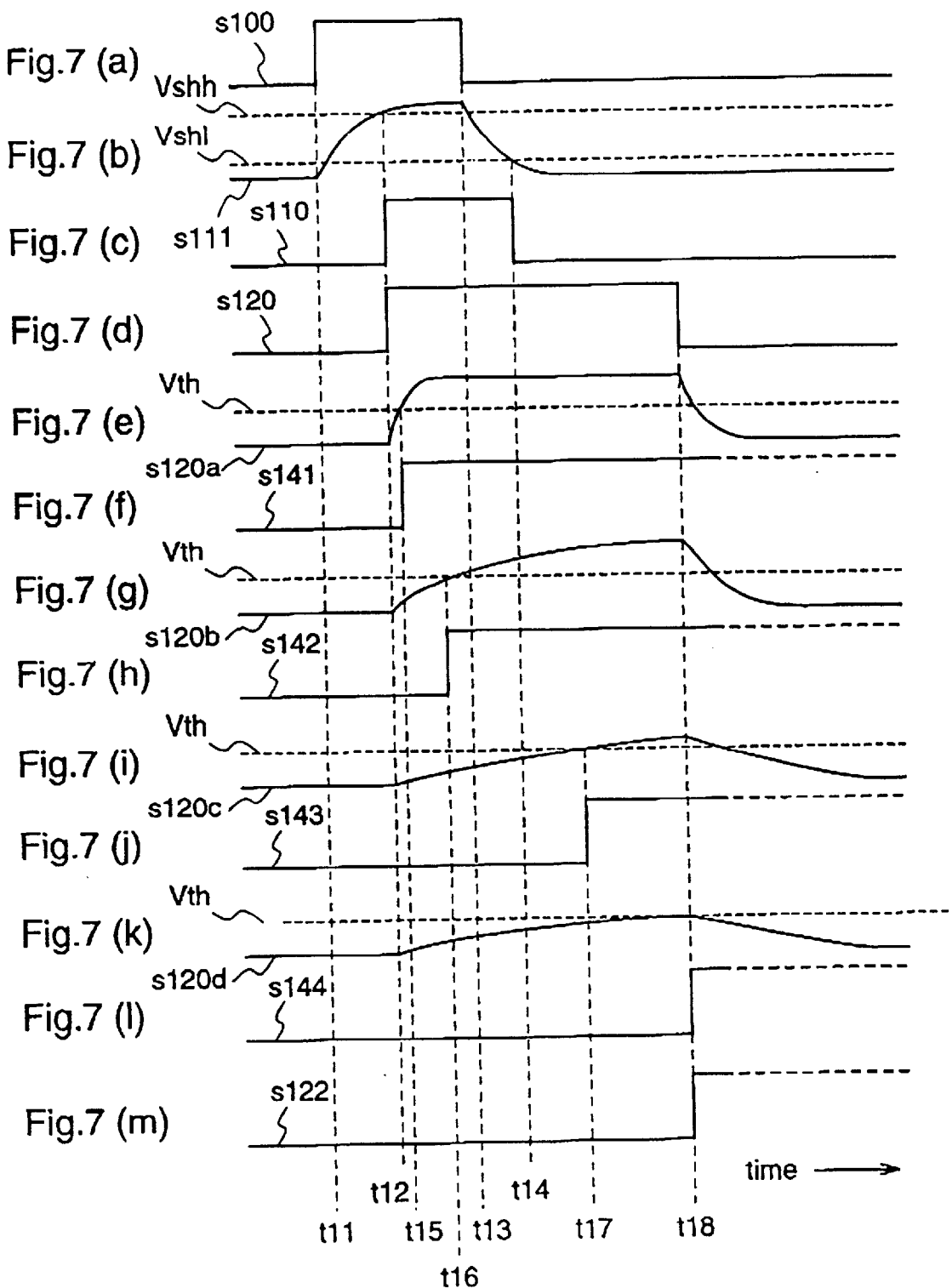
FIGS. 7(a)~7(m) are 1 timing charts in a case where a surge noise or the like is input to the reset circuit of the second embodiment.
Figure 8:
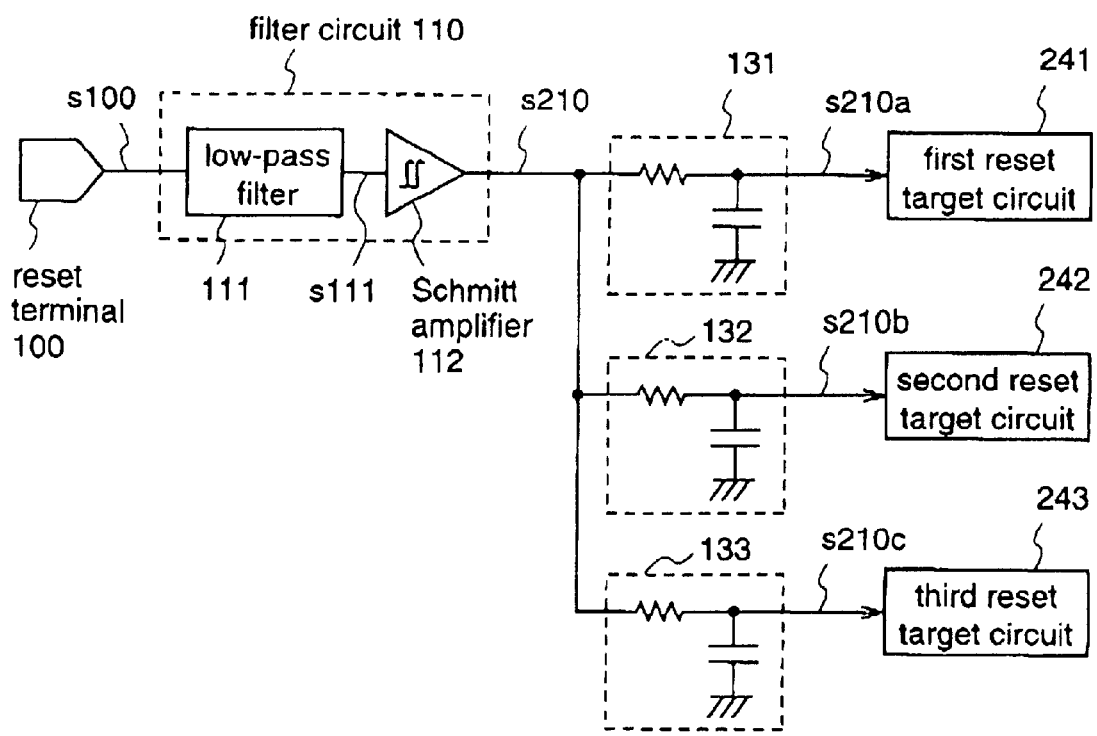
FIG. 8 is a diagram illustrating a structure of a prior art reset circuit.

Hereinafter, the operation of the so-constructed reset circuit according to the second embodiment is described with reference to FIG. 7. FIG. 7 is a signal timing chart for explaining the operation of the reset circuit of the second embodiment. Also in the second embodiment, like in the prior art, assume that a reset terminal input reset signal S100 (FIG. 7(a)) having a short pulse length due to a surge noise or the like is input to the reset terminal 100.

Figure 10:
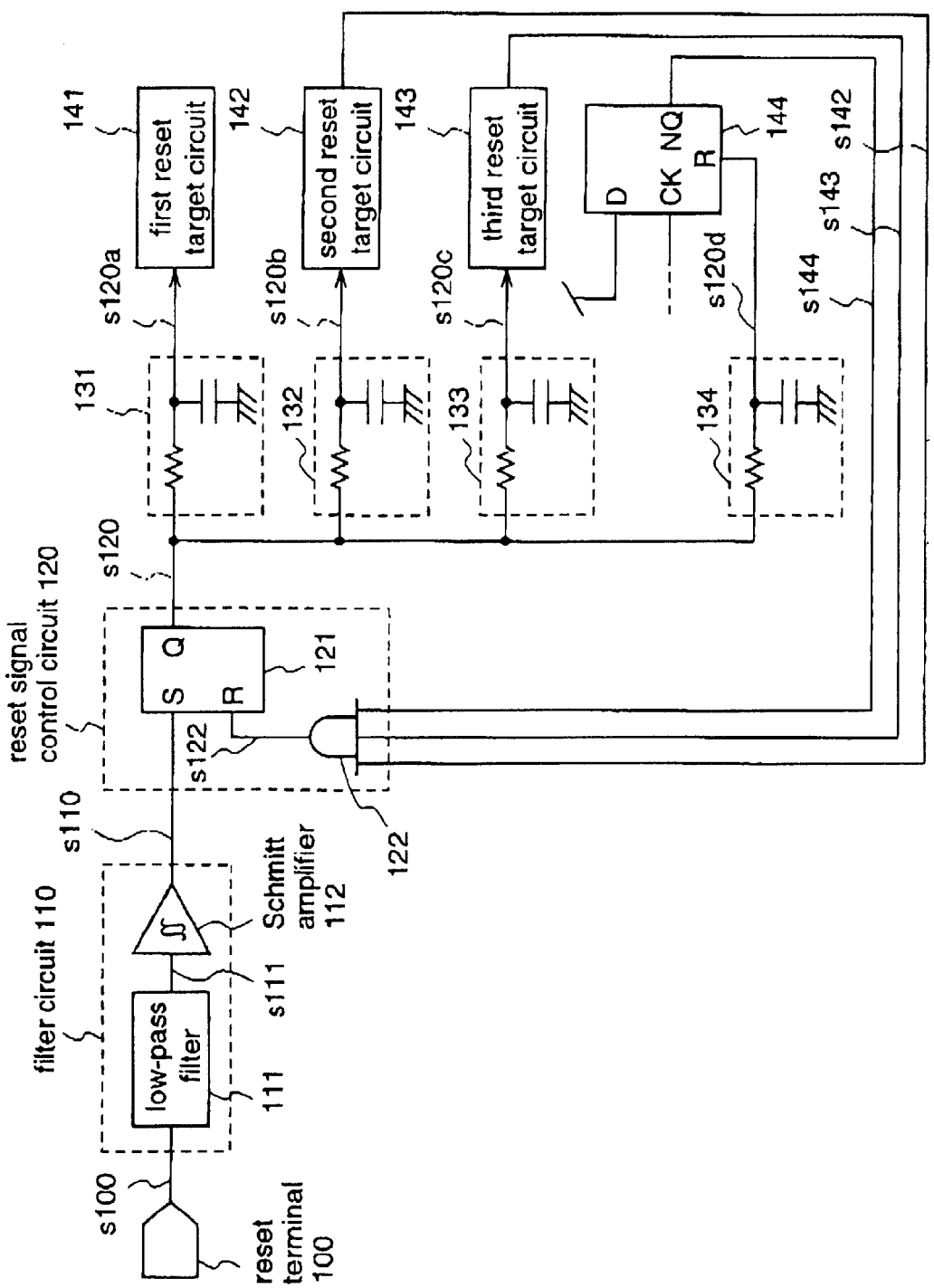
FIG. 10 is a block diagram illustrating a first structure according to a second embodiment of the presently claimed invention.

FIG. 10 is a block diagram illustrating a structure in which some of the reset target circuits among the plural reset target circuits and the corresponding monitor circuits output a reset completion signal in a reset circuit of a semiconductor circuit, according to a second embodiment of the presently claimed invention.

Figure 11:
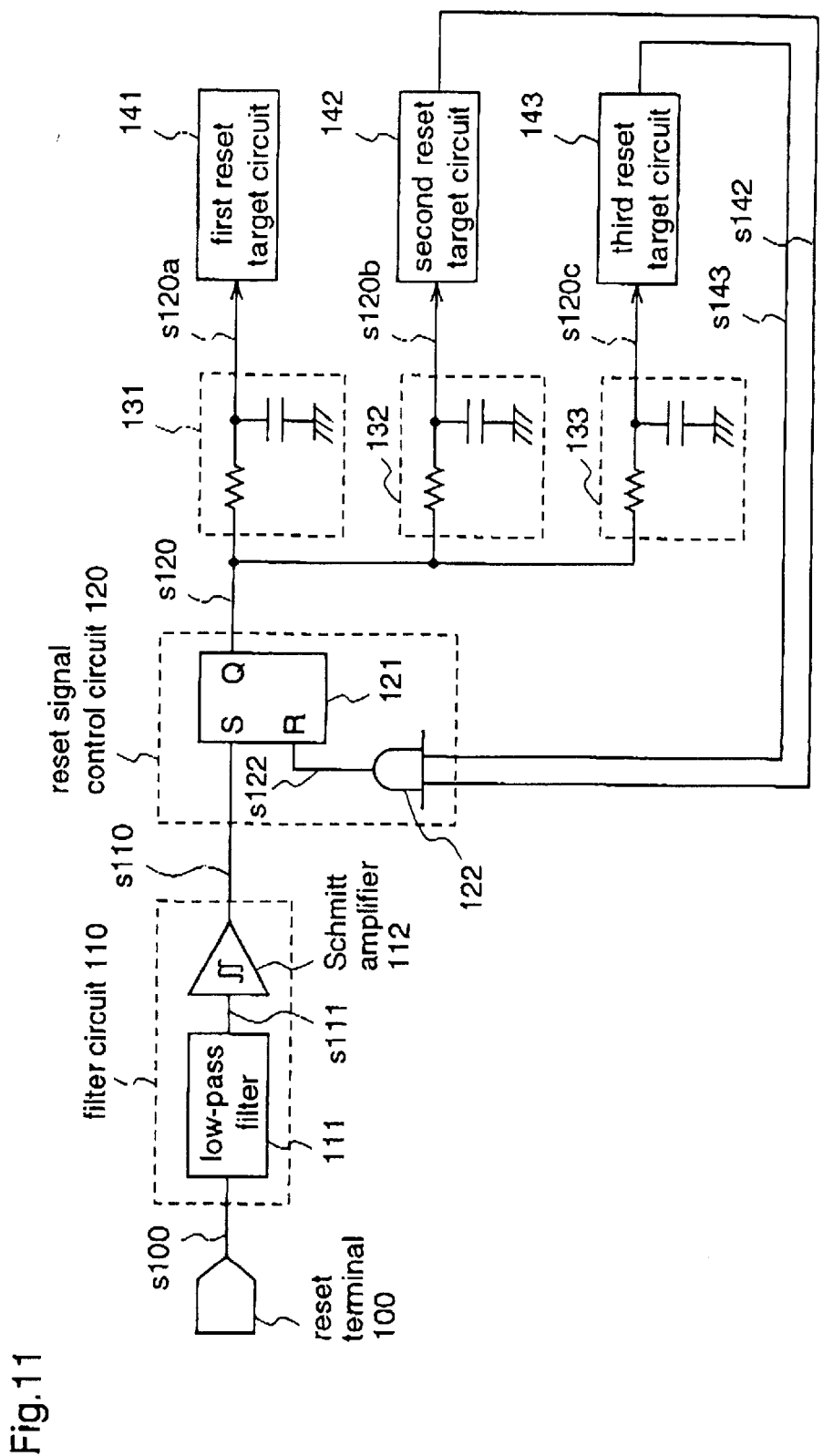
FIG. 11 is a block diagram illustrating a second alternative structure according to a second embodiment of the presently claimed invention.

FIG. 11 is a block diagram illustrating a structure in which some of the reset target circuits among plural reset target circuits output a reset completion signal in the reset circuit of a semiconductor circuit, according a second embodiment of the presently claimed invention.

Figure 12:
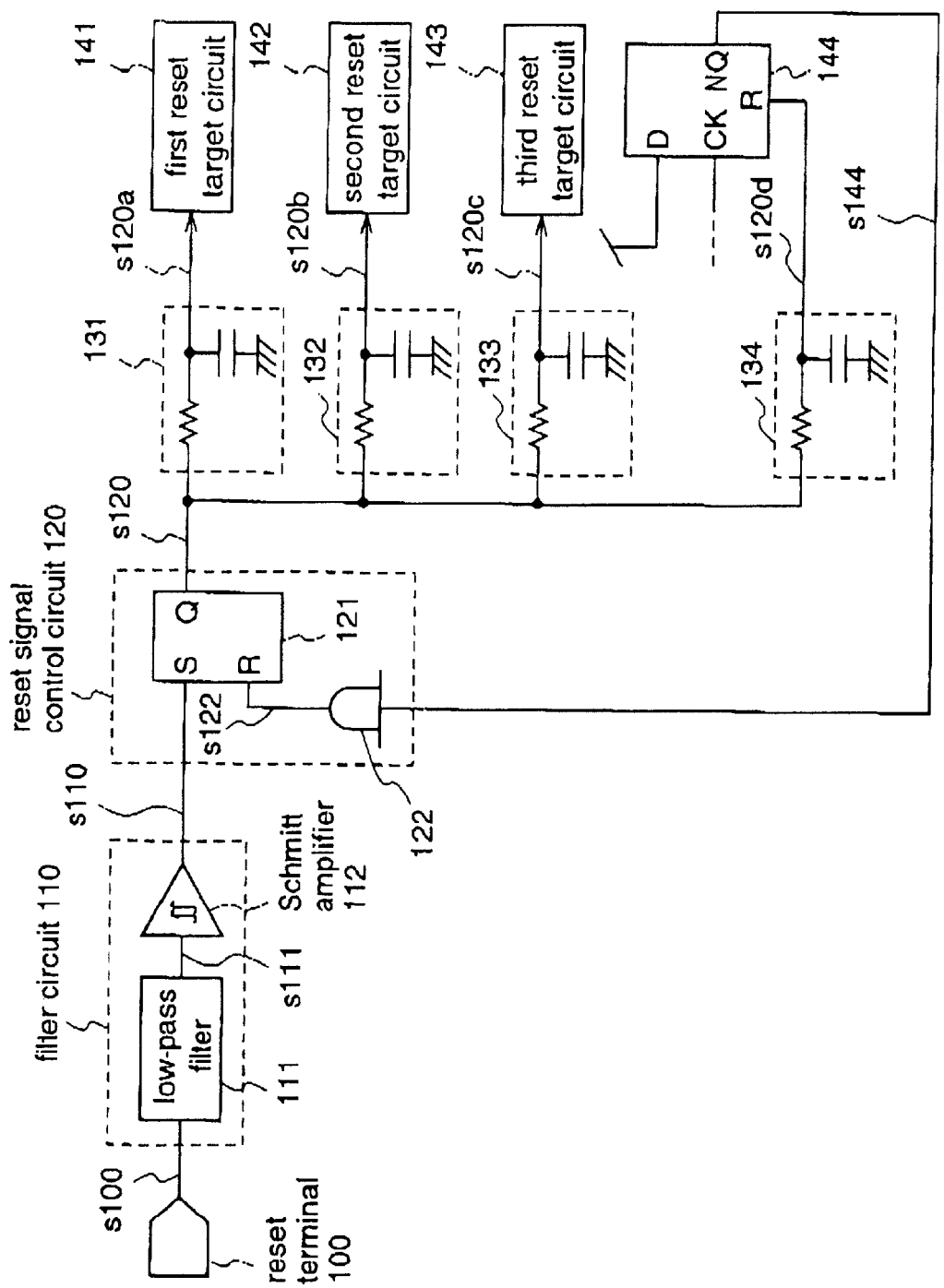
FIG. 12 is a block diagram illustrating a third structure according to a second embodiment of the presently claimed invention.

FIG. 12 is a block diagram illustrating a structure in which only the monitor circuit outputs a reset completion signal in the reset circuit of a semiconductor circuit according to the second embodiment of the presently claimed invention. Initially, at time till, the reset terminal input reset signal S100 which has been input to the reset terminal 100 rises. With its rising, at time t12, a low-pass filter output signal Sill (FIG. 7(b)) which has passed through the low-pass filter 111 becomes higher than an upper threshold Vshh constituting a hysteresis of the Schmitt amplifier 112, and a reset start signal S110 (FIG. 7(c)) which is output from the filter circuit 110 turns into H level. Then, at time t13, the reset terminal input reset signal S100 falls. With its falling, at time t14, a low-pass filter output reset signal S111 which has passed through the low-pass filter 111 becomes lower than the level of a lower threshold Vshl constituting the hysteresis of the Schmitt amplifier 112, and the reset start signal S110 turns into L level.

The reset signal retain means 121 starts retaining the reset instruction signal S120 (FIG. 7(d)) at H level from time t12 when the reset start signal S110 rises. The waveform of the reset instruction signal S120 is blunted by the parasitic impedances 131 to 134 as in the prior art and changed into reset signals S120a to S120d as shown in FIGS. 7(e), 7(g), 7(i) and 7(k), to be input to the first to third reset target circuits 141 to 143 and the monitor circuit 144, respectively. Then, the reset signals S120a to S120d reset the internal operations of the reset target circuits 141 to 143 and the monitor circuit 144, respectively.

When it is detected that the reset signals S120a to S120d have exceeded the threshold Vth for the reset operation and the reset target circuits 141 to 143 and the monitor circuit 144 have been reset, the reset target circuits 141 to 143 and the monitor circuit 144 output the reset completion signals S141 to S144 to the reset signal control circuit 120, respectively. To be more specific, the reset completion signal S141 (FIG. 7(f)) is output from the first reset target circuit 141 at time t15, the reset completion signal S142 (FIG. 7(h)) is output from the second reset target circuit 142 at time t16, and the reset completion signal S143 (FIG. 7(j)) is output from the third reset target circuit 143 at time t17.

When the reset completion signal S144 (FIG. 7(l)) is output from the monitor circuit 144 at time t18, all of the reset completion signals S141 to S144 are at H level. Then, the AND gate 122 makes the reset cancel signal S122 (FIG. 7(m)) rise, and the reset signal retain means 121 makes the reset instruction signal S120 fall at the same time as the rising of the reset cancel signal S122, thereby reliably resetting the plural reset target circuits 141 to 143 of the semiconductor circuit.

As described above, in this second embodiment, in addition to the plural reset target circuits 141 to 143, the monitor circuit which outputs the reset completion signal S144 only when the reset signal S120d is input is included in the semiconductor circuit. Therefore, even in a case where all of the plural reset target circuits 141 to 143 output the reset completion signals S141 to S143 before the reset signals S120a to S120c are input, the reset target circuits can be reliably reset, respectively. Further, the parasitic impedance 134 of the monitor circuit 144 is set the highest in the semiconductor circuit, and the reset signal S120d which is input to the monitor circuit 144 via the parasitic impedance 134 is set to be a reset signal whose waveform is blunted the most in the reset circuit. Therefore, the reset instruction signal S120 does not fall before the monitor circuit 144 is reset by the reset signal S120d whose waveform has been blunted by the highest parasitic impedance 144 and then the reset completion signal S144 is output. Accordingly, the plural reset target circuits 141 to 143 in the semiconductor circuit can be reset more reliably.

Also in this second embodiment, like in the first embodiment, all of the reset target circuits 141 to 143 output the reset completion signals S141 to S143, respectively. However, when only at least one of the reset target circuits 141 to 143, whose reset operation is especially important, outputs the reset completion signal, and the AND gate 122 obtains an AND logic of the reset completion signals which are output from the important reset target circuit and the monitor circuit 144 to output the reset cancel signal S122, the structure in which the reset completion signals are output from not all of the reset target circuits in the semiconductor circuit enables to reliably reset the semiconductor circuit. Particularly, in a large-scale semiconductor circuit, the structure of the semiconductor circuit can be miniaturized with this construction.

Further, in the description of the operation of the reset circuit according to the second embodiment, the reset completion signals S141 to S143 from the reset target circuits 141 to 143 and the reset completion signal S144 from the monitor circuit 144 are used together. However, when the parasitic impedance 134 is the highest among the parasitic impedances 131 to 134, and the reset signal which is input to the monitor circuit 144 has a waveform which is surely blunted the most and which signal is transmitted the latest as compared to the reset signals which are input to the plural reset target circuits 141 to 143, as shown in FIGS. 7, it is possible to output only the reset completion signal S144 from the monitor circuit 144 to the AND gate 122 without outputting the reset completion signals S141 to S143 from the reset target circuits 141 to 143, and use the reset completion signal S144 as the reset cancel signal S122. When the reset circuit is constructed as described above, the same effects as those described above can be obtained as well as, in a large-scale semiconductor circuit, the structure of the semiconductor circuit can be further miniaturized.

In this second embodiment, the parasitic impedances 131 to 134 which accompany the wiring between the reset signal control circuit 120 and the reset target circuit 141 to 143 and the monitor circuit 144 depend on the resistances, capacitances or the like of the wiring, while the reset signals S120a to S120d which are input to the reset target circuits 141 to 143 and the monitor circuit 144 are similarly delayed even when plural stages of transistors are used.

What is claimed is:

1. A reset circuit of a semiconductor circuit, comprising:
   a plurality of reset target circuits, each of the plurality of reset target circuits for being reset by a reset instruction signal, and outputting a respective reset completion signal when reset by the reset instruction signal, wherein at least one of said plurality of reset target circuits comprises an N-bit counter; and
   a reset instruction signal control means for receiving a reset start signal, outputting the reset instruction signal in response to the reset start signal, and controlling a timing for deactivating the reset instruction signal, in accordance with the reset completion signals, wherein
   the reset instruction signal control means for further deactivating the reset instruction signal when all of the reset completion signals from the plurality of reset target circuits are activated.

2. The reset circuit of the semiconductor circuit of claim 1, wherein
   when the reset instruction signal and all of the reset completion signals are simultaneously activated, the reset instruction signal control means is for deactivating the reset instruction signal when the reset start signal is deactivated.

3. The reset circuit of the semiconductor circuit of claim 1, further comprising:
   a filter means for eliminating high frequency components of an input signal; and
   a Schmitt amplifier means for shaping a waveform of a signal which is output from the filter means, wherein an output of the Schmitt amplifier is used as the reset start signal.

4. A reset circuit of a semiconductor circuit, comprising:
   at least one reset target circuit for being reset by a reset instruction signal, and for outputting a respective first reset completion signal when reset by the reset instruction signal;
   a monitor circuit that is reset only by the reset instruction signal and for outputting a second reset completion signal; and
   a reset instruction signal control means for receiving a reset start signal, outputting the reset instruction signal in response to the reset start signal, and controlling a timing for deactivating the reset instruction signal, in accordance with the first reset completion signal from the at least one reset target circuit and the second reset completion signal from the monitor circuit, wherein
   the reset instruction signal control means for further deactivating the reset instruction signal when all of the first and second reset completion signals are activated.

5. The reset circuit of the semiconductor circuit of claim 4, wherein
   when the reset instruction signal and all of the first and second reset completion signals are simultaneously activated, the reset instruction signal control means is for deactivating the reset instruction signal when the reset start signal is deactivated.

6. A reset circuit of a semiconductor circuit, comprising:
   a plurality of reset target circuits for being reset by a reset instruction signal, and part of said plurality of reset target circuits for outputting first reset completion signals when reset by the reset instruction signal, said part of said plurality of reset target circuits comprises at least one reset target circuit, wherein at least one of said plurality of reset target circuits comprises an N-bit counter; and
   a monitor circuit for being reset only by the reset instruction signal and for outputting a second reset completion signal, and
   a reset instruction signal control means for deactivating the reset instruction signal when said second reset completion signal and said respective first reset completion signals, which are output from said part of said plurality of reset target circuits, are activated.

7. The reset circuit of the semiconductor circuit of claim 6, wherein
   when the reset instruction signal and all of the first and second reset completion signals are simultaneously activated, the reset instruction signal control means is for deactivating the reset instruction signal when the reset start signal is deactivated.

8. A reset circuit of a semiconductor circuit, comprising:
   at least one reset target circuit for being reset by a reset instruction signal;
   a monitor circuit for being reset only by the reset instruction signal and for outputting a reset completion signal;
   a reset instruction signal control means for receiving a reset start signal, outputting the reset instruction signal in response to the reset start signal, and controlling a timing for deactivating the reset instruction signal, in accordance with the reset completion signal; and
   delay means respectively arranged between each of said at least one reset target circuit and said monitor circuit, and said reset instruction signal control means, for delaying, respectively, the reset instruction signal directed to said at least one reset target circuit and said monitor circuit, wherein
   the monitor circuit is for receiving the reset instruction signal which has a longest delayed time generated by the delay means, and outputting the reset completion signal when the monitor circuit is reset by the reset instruction signal, and
   the reset instruction signal control means is for deactivating the reset instruction signal when the reset completion signal is activated.

9. The reset circuit of the semiconductor circuit of claim 8, wherein
   when the reset instruction signal and the reset completion signal are simultaneously activated, the reset instruction signal control means is for deactivating the reset instruction signal when the reset start signal is deactivated.

10. A reset circuit of the semiconductor circuit comprising:
    a plurality of reset target circuits, each of the plurality of reset target circuits for being reset by a reset instruction signal, and at least some of said plurality of reset target circuits for outputting reset completion signals when reset by the reset instruction signal, said some of said plurality of reset target circuits comprising at least one reset target circuit, wherein at least one of said plurality of reset target circuits comprises an N-bit counter; and a reset instruction signal control means for receiving a reset start signal, outputting the reset instruction signal in response to the reset start signal, and controlling a timing for deactivating the reset instruction signal, in accordance with the reset completion signal, and the reset instruction signal control means for deactivating the reset instruction signal when the reset completion signals, which are output from said some of the plurality of reset target circuits, are activated.

11. The reset circuit of the semiconductor circuit of claim 7, wherein when the reset instruction signal and all of the reset completion signals are simultaneously activated, the reset instruction signal control means is for deactivating the reset instruction signal when the reset start signal is deactivated.

12. A reset methid for a semiconductor circuit comprising steps of:

receiving a reset start signal by a reset signal control circuit;

activating a reset information signal and outputting said activated reset instruction signal to at least one reset target circuit and a monitor circuit in response to the received reset start signal, said monitor circuit receiving the reset instruction signal having a longest delayed time among said at least one reset target circuit and said monitor circuit;

activating a reset completion signal and outputting said activated reset completion signal from the monitor circuit to the reset signal control circuit; and deactivating the reset instruction signal in accordance with the reset completion signal.

* * * * *